United States Patent [19]

Foster et al.

[11] Patent Number: 5,043,653
[45] Date of Patent: Aug. 27, 1991

[54] NOISE FILTER FOR ZERO CROSSING DETECTOR

[75] Inventors: Joseph E. Foster; Abdul Rashid, both of Rockford, Ill.

[73] Assignee: Sundstrand Corporation, Rockford, Ill.

[21] Appl. No.: 466,653

[22] Filed: Jan. 17, 1990

[51] Int. Cl.⁵ .................. H03M 1/86; H02P 9/30; H03K 5/05
[52] U.S. Cl. .................. 322/32; 322/58; 328/167; 364/724.01
[58] Field of Search .................. 328/109, 133, 167; 322/8, 32, 100, 99, 58; 364/724.01

[56] References Cited

U.S. PATENT DOCUMENTS

| | | | |
|---|---|---|---|
| 4,149,258 | 4/1979 | Yahata et al. | 364/724.01 |
| 4,241,311 | 12/1980 | Massey | 328/109 X |
| 4,533,863 | 8/1985 | Luhn et al. | 322/32 X |
| 4,563,630 | 1/1986 | Woodward et al. | 322/8 |
| 4,669,095 | 5/1987 | Hall | 364/724.01 X |
| 4,775,890 | 10/1988 | Balaban et al. | 328/133 X |
| 4,868,774 | 9/1989 | Beukara | 364/724.01 |

Primary Examiner—R. J. Hickey
Attorney, Agent, or Firm—Wood, Phillips, Mason, Recktenwald & Vansanten

[57] ABSTRACT

A noise filter for the zero crossing detector of a digitized sine wave signal uses an adjustable noise integrator. The noise integrator incorporates a counter. The integration characteristic of the counter is adjustable by selecting a count rate or a count limit from a microprocessor memory.

9 Claims, 4 Drawing Sheets

NOISE FILTER FOR ZERO CROSSING DETECTOR

FIELD OF THE INVENTION

This invention relates to a noise filter for a digitized sine wave signal, zero crossing detector.

BACKGROUND OF THE INVENTION

The control unit for an electrical generating system, as in an aircraft, requires an accurate measure of current and voltage frequency and phase. In the measurement of frequency and phase of a sine wave, it is necessary to determine the zero crossing of the signal. When the signal is noisy, the zero crossing is masked, the circuit is subject to jitter and the determination of zero crossing is subject to error.

The noise characteristics of a generating system vary for different aircraft models. A zero crossing detector has characteristics which are selected for the aircraft in which the control unit is used. Circuits used in the past have been hard wired of semiconductor components, requiring separate design and construction for different aircraft.

In order to reduce weight, size and part count, control unit circuits have been incorporated in custom chips. This approach is suitable, however, only if the chips can be used with different electrical generating systems so that the design cost may be shared.

BRIEF SUMMARY OF THE INVENTION

A principal feature of the invention is a sine wave zero crossing detector which includes a digital zero cross filter with a noise integrator for the digitized sine wave signal. More particularly, the noise integrator is implemented by an up down counter.

Another feature is that the integrator has adjustable limits or rate, for adaptation to the noise pattern of the system with which it is used.

A further feature is that the generator control includes a microprocessor and a memory and that the noise integrator of the filter has an operating characteristic selected from memory by the microprocessor.

Further features and advantages of the invention will readily be apparent from the following specification and from the drawings, in which.

Figure 1:
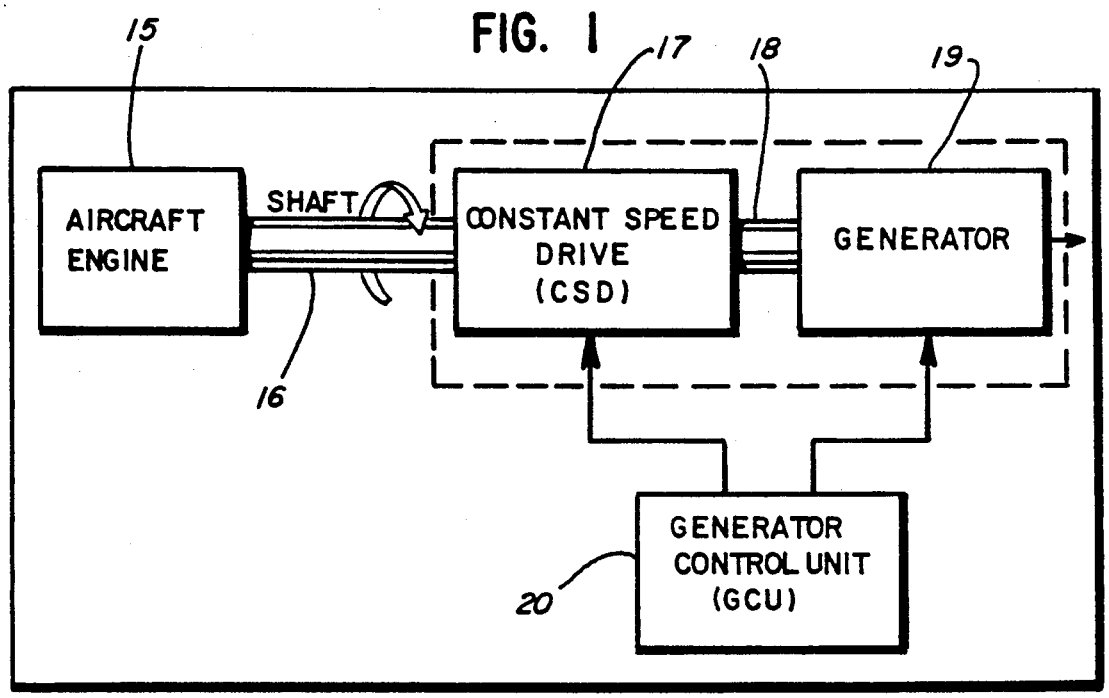
FIG. 1 is a simplified block diagram of an electrical generating system.

A typical aircraft electric power generating system, FIG. 1, is driven by an aircraft engine 15 which will operate over a range of speeds. The output shaft 16 of the aircraft engine drives a mechanical input of constant speed drive 17 which has an output shaft 18 that drives the generator 19. The generator control unit (GCU) 20 monitors system conditions, including the speed of shaft 16 and the speed, frequency, voltage and current of generator 19. GCU 20 provides an output to a control input of constant speed drive 17 which keeps the speed of the shaft 18 and thus the frequency of generator 19 within prescribed limits. Another output of GCU 20 controls generator field current to maintain the generator output voltage within limits.

Figure 2:
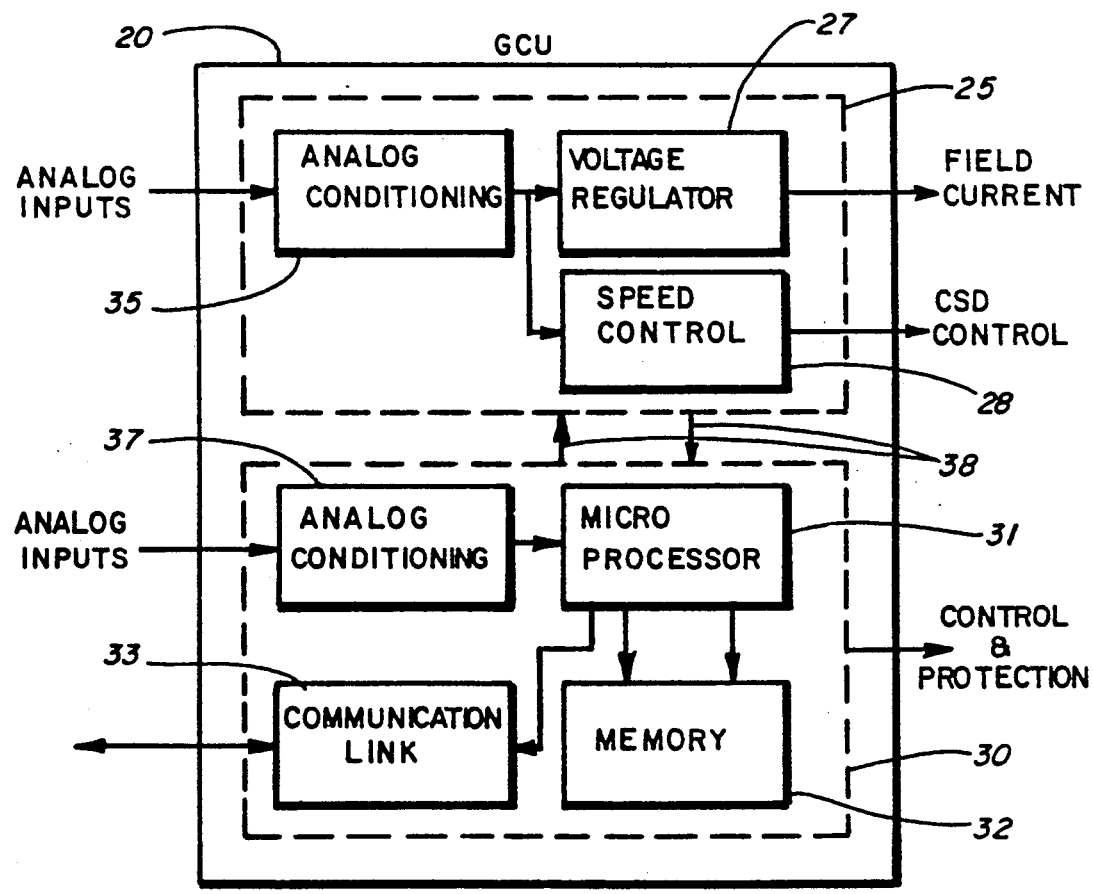
FIG. 2 is a simplified block diagram of a control unit in which the zero crossing detector is used.

The GCU 20 is illustrated in functional form in FIG. 2. A control section 25 includes voltage regulator and speed control blocks 27, 28 respectively. A protection section 30 incorporates a microprocessor 31 with memory 32. A communication link 33 is interconnected with the control units of other generators. In the control section 25, analog inputs are connected with an analog signal conditioning block 35 which conditions the signals and converts them to digital form. The voltage regulator 27 and speed control blocks 28 are preferably digital circuits in VLSI form. Outputs include field current for excitation of the generator and a speed signal for the constant speed drive 17.

The protection section 30 also has an analog signal conditioning block 37, the output of which is connected with microprocessor 31. The control and protection outputs of protection section 30 connect loads to and remove loads from generator 19 and provide for paralleling of generators in a multigenerator system. The control and protection sections communicate as indicated by the arrows 38. Microprocessor 31 and memory 32 provide selected operating parameters for circuits in the control unit 25 will be indicated below.

Figure 3:
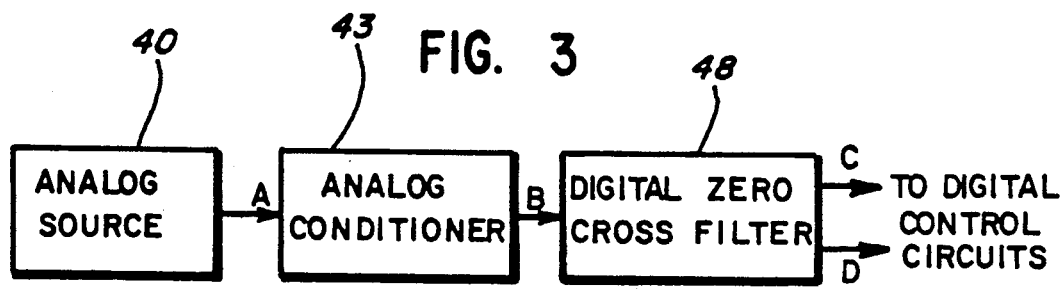
FIG. 3 is a block diagram of a portion of the control unit including the digital zero cross filter FIG. 4 are waveforms illustrating the operation of FIG. 3.
Figure 4A:
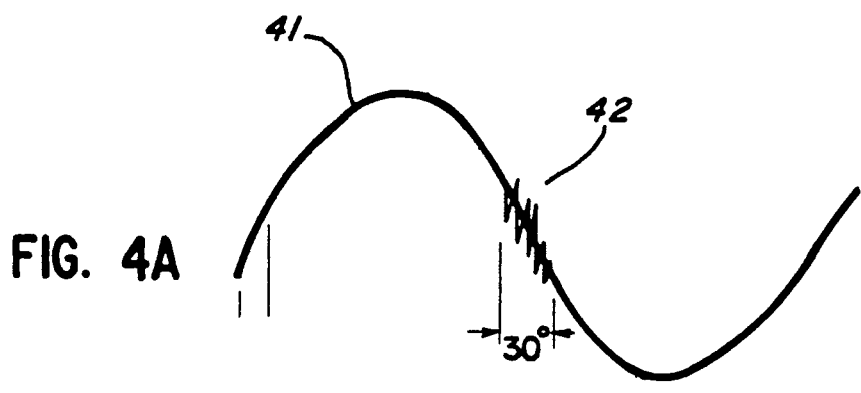

The zero crossing filter of this invention may be used with voltage or current sine wave signals. An analog source 40, FIG. 3, has a sine wave output as shown in FIG. 4A. The signal is subject to noise 42 which tends to mask the zero crossing point as indicated. Typically, the noise of interest is in a 30° band centered at the zero crossing.

Figure 4B:
Figure 4C:
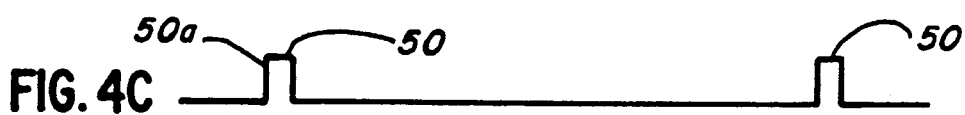
Figure 4D:
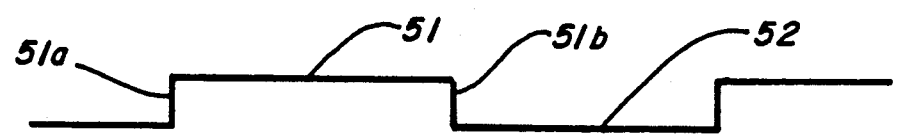

Analog conditioner 43 clips the analog waveform as shown in FIG. 4B. The clipped signal 45, referred to herein as a digitized sine wave, is still subject to noise at the zero crossing, indicated diagrammatically at 46. The filter 48, which is the subject of this invention, has filtered outputs C and D shown in FIGS. 4C and 4D. The output waveform at C is a positive pulse 50 corresponding with the positive going zero crossing of analog sine wave 41. The output waveform at D is a digital signal with a high level 51 corresponding with the positive half cycle of analog sine wave 41 and a low level 52 corresponding with the negative half cycle of the analog sine wave. The leading edges 50a of waveform C and 51a of waveform D correspond in time with the positive going zero crossing of the analog sine wave 41. The trailing edge 51b of waveform D corresponds with the negative going zero crossing of the analog sine wave. The time of occurrence of the zero crossings may be determined with certainty from the filtered waveforms.

Figure 5:
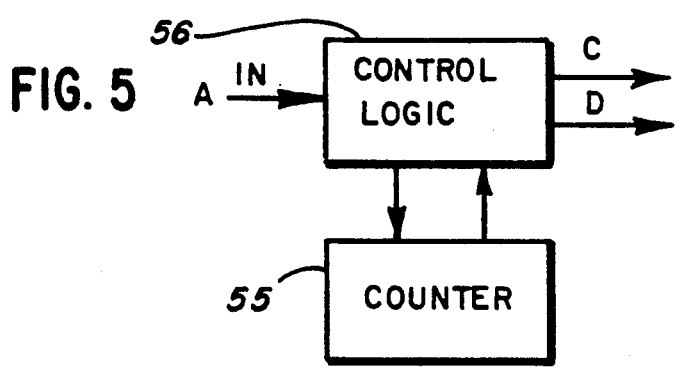
FIG. 5 is a block diagram of a noise counter.
Figure 6A:
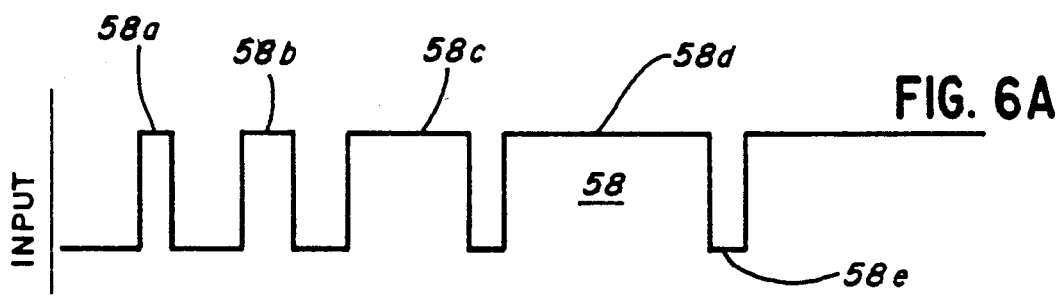
FIGS. 6 and 7 are waveforms illustrating operation of the noise counter of FIG. 5.

In accordance with the invention, digitized signal 4B is integrated in zero cross filter 48. A preferred form of integrator is illustrated in FIG. 5. An up down noise counter 55 with associated control logic 56 performs an integrating function. The waveforms of FIG. 6 illustrate the operation with a positive going zero crossing of the sine wave. The noise pulses 58 of the digitized sine wave, FIG. 6A, are summed by counter 55 as indicated by count waveform 59 in FIG. 6B. The noise pulses 58, FIG. 6A, are illustrated on an expanded time base as compared with FIG. 4B. The noise pulses differ in time duration. The count starts at the low threshold 60 and, when it reaches the high threshold 61, the outputs C and D shift from low to high. The output C.

Figure 6B:
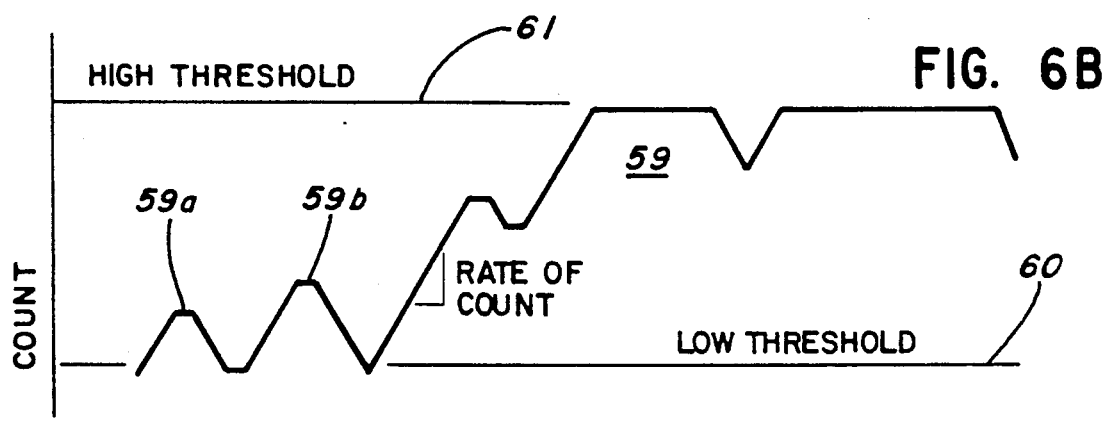
Figure 6C:
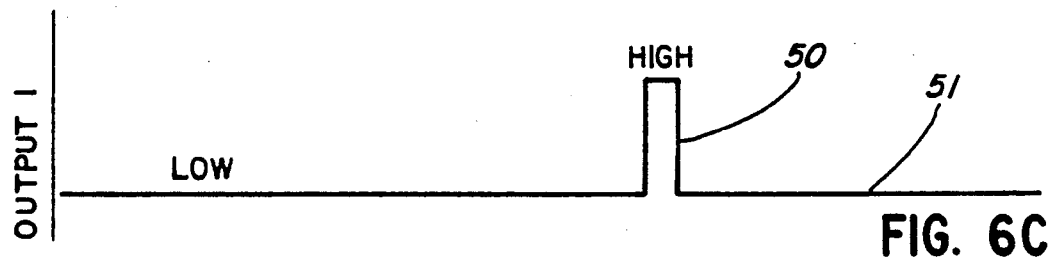
Figure 6D:
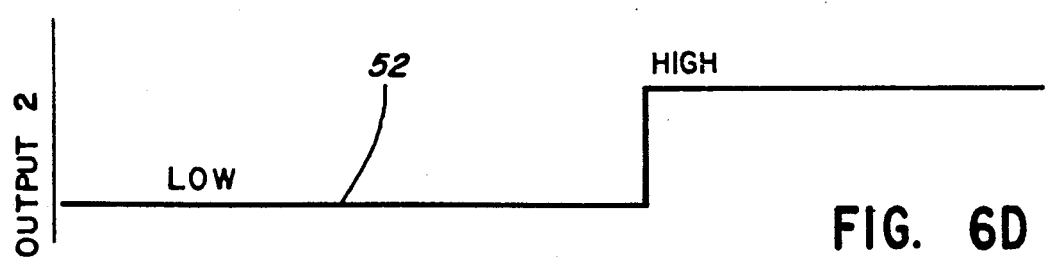
Figure 7A:
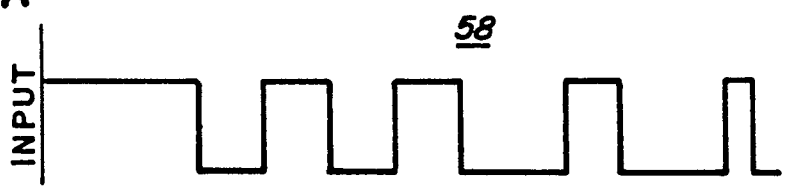
Figure 7B:
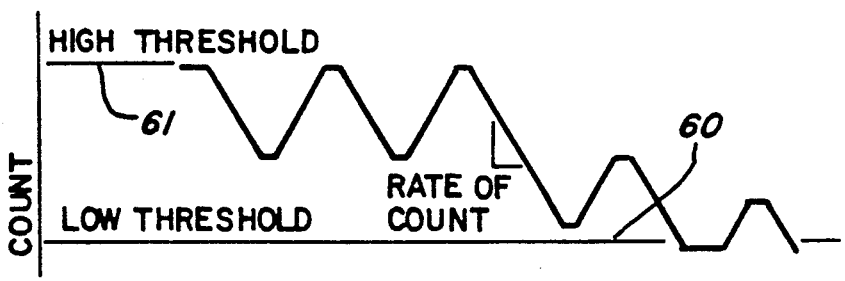
Figure 7C:
Figure 7D:
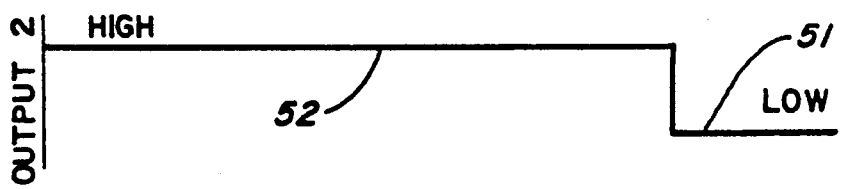

FIG. 6C, is pulse 50 indicating the positive going zero crossing of the sine wave. The output D, FIG. 6D, is digitized signal 51, 52 which indicates both the zero crossing and the polarity of the sine wave.

The count accumulated by counter 55, represented by waveform 59 in FIG. 6B, is a function of time duration of the noise pulses and the counting rate which determines the slope of the waveform. More particularly, noise pulse 58a has a short time duration followed by a relatively long time before the occurrence of the next noise pulse 58b. The count corresponding with noise pulse 58a is shown at 59a and the count then returns to the low threshold. The count for noise pulse 58b, shown at 59b, rises a higher level as the noise pulse is of longer duration. The count does not return to the low threshold 60 following noise pulse 58c as the interval before noise pulse 58b is relatively short. When the count reaches the high threshold, output waveforms 60C and D are generated. The short negative noise pulse 58e, following the zero crossing, does not cause the count to return to the low threshold and the outputs C, D are unchanged.

The waveforms of FIG. 7 similarly illustrate operation of counter 55 and control logic 56 with the negative going zero crossing of the sine wave 41. The noise pulses 58, FIG. 7A, are integrated by counter 55 as shown in FIG. 7B. When the count of the counter has reached the low threshold 60, output D goes low as shown at 51, FIG. 7D.

In accordance with the invention, a characteristic of the integrator of the digital zero cross filter is selected to complement the noise patterns of the aircraft electrical system. More particularly, a desired integrator sensitivity is established by selecting either the integration rate or the integrator limits. The integrator rate may be expressed as integrator rate = increment rate × clock frequency.

For a noisy signal, a smaller increment rate will be used than with a noise-free signal. Alternatively, the integrator limits are selected in accordance with the noise to be filtered. The integrator count, N, may be expressed as $$N = \frac{rad \times 1 \times 40^7}{2 \times \pi \times 400} \text{ (counts)}$$

Where, $$rad = \frac{\pi \times (\text{Angle in degrees})}{180}$$

For 15° noise spikes, the count is approximately 1042. It is likely that any signal will be subject to some noise. Accordingly, a minimum count, as 7, may be hard wired or programmed in the counter.

In either event, the filter is preferably implemented in a programmable processor embodied in a custom chip which is a part of the generator control unit 20. The operating parameters for the up down counter 55, 56 of the digital zero cross filter 48 are selected from memory 32 and coupled with the custom chip as by microprocessor 31. Thus, the filter is matched with the aircraft noise characteristics by providing appropriate data in memory 32 and programming for microprocessor 31. It is unnecessary to design and construct a different hard wired circuit for each model aircraft. Other memory sequencing devices, as a counter, for example, may be used to transfer data from memory 32 to the custom chip. It will be understood that where a microprocessor is described in this capacity, other devices could be substituted.

We claim:
1. In an electrical generating system control responsive to system condition signals, including a digitized sine wave signal which is subject to noise, for monitoring generator speed and voltage, an improved means for detecting sine wave zero crossing of said digital sine wave signals, including:
   a filter for said digitized sine wave signal, said filter including a noise integrator which integrates the noise accompanying the sine wave, the output of the filter indicating zero crossing of the sine wave.
2. The zero crossing detector of claim 1 in which said noise integrator is adjustable.
3. The zero crossing detector of claim 2 in which said noise integrator has an adjustable rate.
4. The zero crossing detector of claim 2 in which the noise integrator has an adjustable limit.
5. The zero crossing detector of claim 4 in which said noise integrator is bidirectional and has adjustable upper and lower limits.
6. The zero crossing detector of claim 2 in which said control includes a microprocessor and a memory, and said noise integrator has an adjustable characteristic selected from memory by said microprocessor.
7. The zero crossing detector of claim 1 in which said noise integrator is an up down counter.
8. The zero crossing detector of claim 7 in which said integrator has an adjustable counting rate.
9. The zero crossing detector of claim 7 in which said integrator is bidirectional and has adjustable upper and lower count limits.

* * * * *